United States Patent
Sakai

(10) Patent No.: US 10,063,249 B2
(45) Date of Patent: Aug. 28, 2018

(54) AUDIO CIRCUIT FOR SUPPRESSING DC SHOCK NOISE

(71) Applicant: ROHM CO., LTD., Ukyo-Ku, Kyoto (JP)

(72) Inventor: Mitsuteru Sakai, Kyoto (JP)

(73) Assignee: ROHM CO., LTD., Kyoto (JP)

(\*) Notice: Subject to any disclaimer, the term of this patent is extended or adjusted under 35 U.S.C. 154(b) by 139 days.

(21) Appl. No.: 15/133,817

(22) Filed: Apr. 20, 2016

(65) Prior Publication Data

US 2016/0316294 A1    Oct. 27, 2016

(30) Foreign Application Priority Data

Apr. 24, 2015 (JP) ................. 2015-089557

(51) Int. Cl.
  *H03G 3/00* (2006.01)
  *H03M 1/66* (2006.01)
  (Continued)

(52) U.S. Cl.
  CPC .............. *H03M 1/66* (2013.01); *H03F 3/187* (2013.01); *H03F 3/20* (2013.01); *H03F 3/213* (2013.01);
  (Continued)

(58) Field of Classification Search
  CPC ....... H04R 5/04; H04R 2499/15; H03F 3/213; H03F 3/68; H03F 3/187; H03F 2200/03; H03F 2200/375; H03M 1/742
  (Continued)

(56) References Cited

U.S. PATENT DOCUMENTS

| 6,111,529 A | * | 8/2000 | Maulik | ................. H03M 3/382 341/120 |
| 2007/0091207 A1 | * | 4/2007 | Aufranc | ............. H04N 21/2368 348/462 |

(Continued)

FOREIGN PATENT DOCUMENTS

JP    2008278117 A    11/2008

*Primary Examiner* — Katherine Faley
(74) *Attorney, Agent, or Firm* — Cantor Colburn LLP

(57) ABSTRACT

A D/A converter converts digital audio data $D_{IN}$ into analog differential audio signals $V_P$ and $V_N$. A differential to single-ended conversion circuit converts the differential audio signals $V_P$ and $V_N$ into a single-ended audio signal $V_{SE}$. A volume circuit receives the single-ended audio signal $V_{SE}$, and amplifies the single-ended audio signal $V_{SE}$ with a gain that corresponds to a volume value. A reference voltage source generates a reference voltage $V_{REF}$ commonly referred by the differential to single-ended conversion circuit and the volume circuit. In a calibration operation, a calibration circuit controls the D/A converter so as to shift at least one from among the differential audio signals $V_P$ and $V_N$ such that the difference between the output voltage $V_{SE}$ of the differential to single-ended conversion circuit and the reference voltage $V_{REF}$ approaches zero.

12 Claims, 8 Drawing Sheets

(51) Int. Cl.
*H03F 3/20* (2006.01)
*H03M 1/70* (2006.01)
*H03F 3/187* (2006.01)
*H03F 3/213* (2006.01)
*H03F 3/68* (2006.01)
*H03M 1/74* (2006.01)
*H03G 3/30* (2006.01)

(52) U.S. Cl.
CPC ........... *H03F 3/68* (2013.01); *H03M 1/70* (2013.01); *H03F 2200/03* (2013.01); *H03F 2200/375* (2013.01); *H03G 3/3005* (2013.01); *H03M 1/742* (2013.01)

(58) Field of Classification Search
USPC .................................. 381/28, 86, 104, 120
See application file for complete search history.

(56) References Cited

U.S. PATENT DOCUMENTS

2010/0329482 A1* 12/2010 Lee .................. H03G 3/002
381/104
2013/0243223 A1* 9/2013 Sakai ................ H03F 3/187
381/120

* cited by examiner

AUDIO CIRCUIT FOR SUPPRESSING DC SHOCK NOISE

CROSS-REFERENCE TO RELATED APPLICATIONS

This application is based upon and claims the benefit of priority from the prior Japanese Patent Application No. 2015-089557, filed Apr. 24, 2015, the entire contents of which are incorporated herein by reference.

BACKGROUND OF THE INVENTION

1. Field of the Invention

The present invention relates to an audio circuit.

2. Description of the Related Art

An electronic device having a function of playing back an audio signal, examples of which include CD players, audio amplifiers, car stereo systems, portable radios, portable audio players, and the like, includes a sound processor that provides an audio signal with various kinds of signal processing. FIG. 1 is a block diagram showing a typical configuration of an audio system.

An audio system 100 includes a sound source 102, an analog amplifier 104, an A/D converter 106, a DSP 108, a D/A converter 210, a volume circuit 220, a power amplifier 110, and an electroacoustic conversion element 112.

The sound source 102 is configured as a CD player, silicon audio player, cellular phone terminal, or the like, which outputs an analog audio signal. The analog amplifier 104 amplifies the analog audio signal received from the sound source 102 such that its output matches the input range of the A/D converter 106 configured as a downstream stage. The DSP 108 receives a digital audio signal from the A/D converter 106, and performs predetermined digital signal processing on the digital audio signal thus received. Examples of such signal processing performed by the DSP 108 include equalizing, bass boost, treble boost, monaural/stereophonic conversion, digital volume control, and the like.

The D/A converter 210 converts the digital audio signal, which has been subjected to signal processing by the DSP 108, into an analog audio signal. The volume circuit 220 amplifies the output signal of the D/A converter 210 with a gain that corresponds to a volume value. The power amplifier 110 amplifies the output of the volume circuit 220, so as to drive the electroacoustic conversion element 112 configured as a speaker or headphones.

With such an audio system 100, by inserting the volume circuit 220 as a downstream stage of the D/A converter 210, such an arrangement provides improved noise characteristics when the volume is reduced.

FIGS. 2A and 2B are circuit diagrams each showing a function IC (Integrated Circuit) including the D/A converter 210 and the volume circuit 220. The D/A converter 210 has offset error that is non-zero. Thus, such an arrangement requires a measure for suppressing the occurrence of DC shock noise when the volume is switched. In the configuration shown in FIG. 2A, by inserting a DC block capacitor between the D/A converter 210 and the volume circuit 220, such an arrangement allows the DC noise components to be removed. However, such an arrangement is not capable of removing a noise component having a low frequency that is in the vicinity of the DC level.

In the configuration shown in FIG. 2B, the volume circuit 220 is provided with a soft switch circuit 120. The soft switch circuit 120 gradually changes the volume (attenuation amount) over the period of a given time constant. Such a configuration shown in FIG. 2B requires a long time to remove the DC noise when the volume is switched, which is a problem.

SUMMARY OF THE INVENTION

The present invention has been made in order to solve such a problem. Accordingly, it is an exemplary purpose of an embodiment of the present invention to provide an audio circuit which is capable of suppressing the occurrence of DC shock noise.

An embodiment of the present invention relates to an audio circuit. The audio circuit comprises: a differential D/A converter that converts digital audio data into an analog differential audio signal; a differential to single-ended conversion circuit that converts the differential audio signal into a single-ended audio signal; a volume circuit that receives the single-ended audio signal, and amplifies the single-ended audio signal with a gain that corresponds to a volume value; a reference voltage source that generates a reference voltage commonly referred by the differential to single-ended conversion circuit and the volume circuit; and a calibration circuit that controls the differential D/A converter so as to shift at least one component of the differential audio signal such that a difference between an output voltage of the differential to single-ended conversion circuit and the reference voltage becomes zero.

In a case in which there is not an offset voltage in both the differential D/A converter and the differential to single-ended conversion circuit, the output voltage of the differential to single-ended conversion circuit matches the reference voltage. Conversely, in a case in which there is an offset in either the differential D/A converter or the differential to single-ended conversion circuit, the output voltage of the differential to single-ended conversion circuit deviates from the reference voltage. Directing attention to this mechanism, the reference voltage and the output of the differential to single-ended conversion circuit are monitored, and a calibration operation is performed such that they match each other, thereby canceling out the effects of the offset voltage. By canceling out the offset voltage, such an arrangement is capable of reducing DC shock noise that can occur when the audio circuit is started up or when the volume is switched.

Also, the calibration circuit may comprise: a first voltage comparator that compares the output voltage of the differential to single-ended conversion circuit with the reference voltage, and that generates a first comparison signal that indicates a comparison result; an offset adjuster that controls the differential D/A converter so as to shift at least one component of the differential audio signal; and a logic circuit that changes an offset amount to be applied from the offset adjuster, while monitoring the first comparison signal.

Also, the calibration circuit may operate after a predetermined time period elapses after the audio circuit is started up.

This allows the calibration to be performed after the voltage applied to the internal circuit becomes the same level as that in the normal operation.

Also, the reference voltage source may comprise: a first resistor and a second resistor arranged in series between a power supply line and a ground line; a capacitor connected to a connection node that connects the first resistor and the second resistor; and a voltage follower that receives a voltage at the connection node, and that outputs the reference voltage.

Also, the calibration circuit may further comprise: a threshold voltage source that generates a predetermined threshold voltage; and a second voltage comparator that compares the reference voltage with the threshold voltage, and asserts a second comparison signal when the reference voltage exceeds the threshold voltage. Also, when the second comparison signal is asserted, the logic circuit may start the calibration operation.

This allows the calibration to be performed after the reference voltage becomes the same level as that in the normal operation.

Also, a common comparator may be employed as both the first voltage comparator and the second voltage comparator. This allows the circuit area to be reduced.

Also, the differential D/A converter may be configured as a current segment D/A converter. Also, the offset adjuster may comprise a correction current segment group connected such that an output thereof is connected to an output of a current segment group of the differential D/A converter so as to form a common output. Also, the logic circuit may control an on/off operation of each of multiple current sources included in the correction current segment group.

Such an arrangement is capable of applying an offset to the output of the differential D/A converter.

Also, the differential D/A converter may be configured as a switched capacitor filter D/A converter.

Also, the audio circuit may be monolithically integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants.

Another embodiment of the present invention relates to an in-vehicle audio apparatus. The in-vehicle audio apparatus comprises any one of the aforementioned audio circuits.

Yet another embodiment of the present invention relates to an audio component apparatus. The audio component apparatus comprises any one of the aforementioned audio circuits.

Yet another embodiment of the present invention relates to an electronic device. The electronic device comprises any one of the aforementioned audio circuits.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 5 is an operation waveform diagram showing the operation of the audio circuit after a power supply is turned on;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
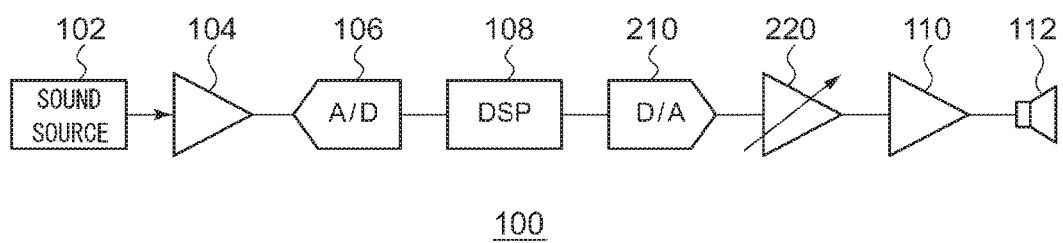
FIG. 1 is a block diagram showing a typical configuration of an audio system.
Figure 2A:
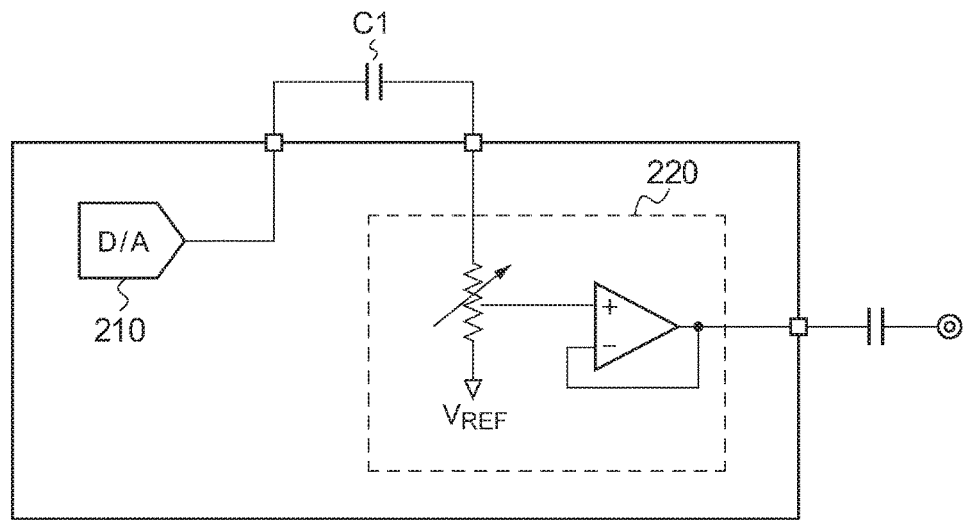
FIGS. 2A and 2B are circuit diagrams each showing a function IC including a D/A converter and a volume circuit.
Figure 2B:
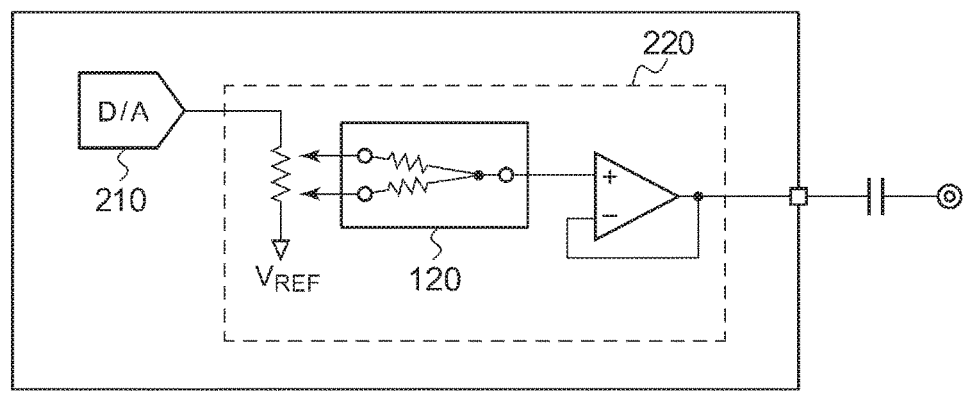
Figure 3:
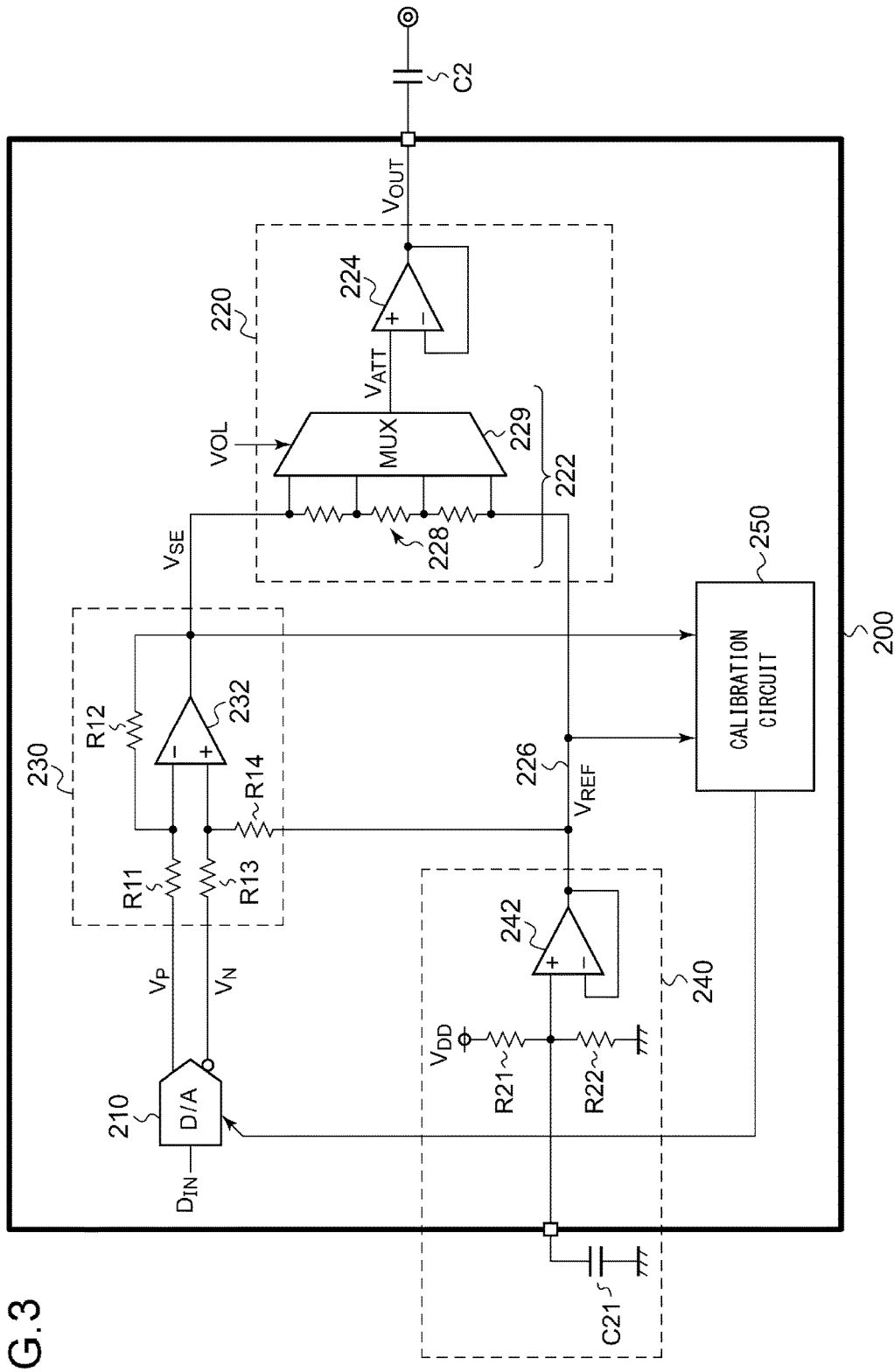
FIG. 3 is a circuit diagram showing an audio circuit according to an embodiment.

FIG. 3 is a circuit diagram showing an audio circuit 200 according to an embodiment. The audio circuit 200 includes a part of the audio system 100 shown in FIG. 1, which is configured as a function IC (Integrated Circuit) monolithically integrated on a single semiconductor substrate. Specifically, the audio system 100 includes the D/A converter 210 through the volume circuit 220 shown in FIG. 1.

The audio circuit 200 includes a differential D/A converter (which will simply be referred to as the "D/A converter" hereafter) 210, a differential to single-ended conversion circuit 230, a volume circuit 220, a reference voltage source 240, and a calibration circuit 250.

The D/A converter 210 receives digital audio data $D_{IN}$ from an unshown DSP 108 configured as an upstream stage, and converts the digital audio data $D_{IN}$ into analog differential audio signals $V_P$ and $V_N$.

The differential to single-ended conversion circuit 230 converts the differential audio signals $V_P$ and $V_N$ into a single-ended audio signal $V_{SE}$. The differential to single-ended conversion circuit 230 includes an operational amplifier 232 and resistors R11 through R14. It should be noted that the configuration of the differential to single-ended conversion circuit 230 is not restricted in particular. Furthermore, a reference voltage $V_{REF}$ is supplied to the differential to single-ended conversion circuit 230. The differential to single-ended conversion circuit 230 performs differential to single-ended conversion based on the reference voltage $V_{REF}$.

The volume circuit 220 receives the single-ended audio signal $V_{SE}$, and amplifies the single-ended audio signal $V_{SE}$ with a gain (attenuation ratio) that corresponds to the volume setting value. The output voltage $V_{OUT}$ of the volume circuit 220 is supplied to an unshown power amplifier via a capacitor C2. The volume circuit 220 is configured as a non-inverting variable amplifier including a variable attenuator 222 and a non-inverting amplifier (voltage follower) 224. The variable attenuator 222 includes a resistor ladder 228 and a multiplexer 229. The resistor ladder 228 includes multiple resistors connected in series between the output of the differential to single-ended conversion circuit 230 and a reference voltage line 226 to which the reference voltage $V_{REF}$ is supplied. A tap is drawn from each node that connects adjacent resistors of the multiple resistors. The multiplexer 229 selects one from among the multiple taps according to the volume setting value VOL. The non-inverting amplifier 224 receives an output voltage $V_{ATT}$ of the variable attenuator 222, and outputs the voltage $V_{OUT}$ having the same electric potential.

The reference voltage source 240 generates the reference voltage $V_{REF}$ configured as a common reference voltage to be used by both the differential to single-ended conversion circuit 230 and the volume circuit 220. The reference voltage source 240 includes a first resistor R21, a second resistor R22, an operational amplifier 242, and an external capacitor C21. The first resistor R21 and the second resistor R22 are arranged in series between a power supply ($V_{DD}$) line and a ground (GND) line. The capacitor C21 is connected to a connection node that connects the two resistors R21 and R22. The operational amplifier 242 is configured as a voltage follower, which outputs the voltage across the capacitor C21 as the reference voltage $V_{REF}$.

In the calibration mode, the calibration circuit 250 controls the D/A converter 210 so as to shift at least one from among the differential audio signals $V_P$ and $V_N$ such that the difference between the reference voltage $V_{REF}$ and the output voltage $V_{SE}$ of the differential to single-ended conversion circuit 230 approaches zero. In the calibration mode, the input to the D/A converter 210 is fixed to zero. The calibration result, i.e., the shift amount, is stored in memory such as a register or the like. In the normal audio playback mode, the shift amount stored in the memory is fixedly used.

Figure 4:
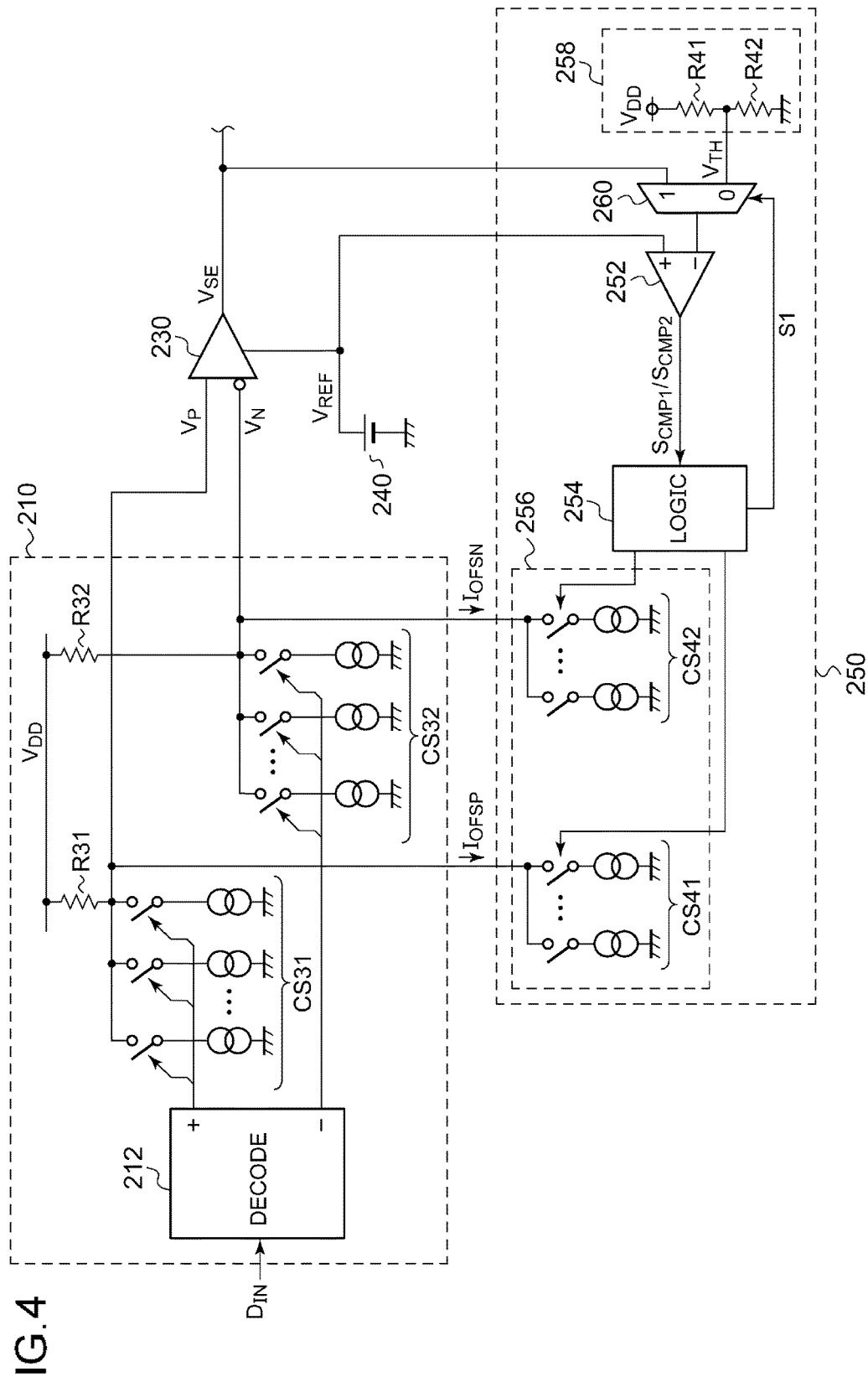
FIG. 4 is a circuit diagram showing a specific example configuration of the D/A converter and the calibration circuit.

FIG. 4 is a circuit diagram showing a specific example configuration of the D/A converter 210 and the calibration circuit 250.

The calibration circuit 250 includes a voltage comparator 252, a logic circuit 254, and an offset adjuster 256.

The voltage comparator (first comparator) 252 compares the reference voltage $V_{REF}$ with the output voltage $V_{SE}$ of the differential to single-ended conversion circuit 230. The offset adjuster 256 controls the D/A converter 210 so as to shift at least one from among the differential audio signals $V_P$ and $V_N$. With this circuit configuration, the offset adjuster 256 shifts the differential audio signals $V_P$ and $V_N$ toward the lower electric potential side.

In the present embodiment, the D/A converter 210 is configured as a current-segment D/A converter including a pair of current segment groups CS31 and CS32 designed according to the digital audio data (input code) $D_{IN}$. Each current segment group is configured to allow each current segment to be independently turned on and off. Furthermore, the output of each current segment of each current segment group is connected to a common output. The current to be supplied by each current segment may be weighted in a binary manner. Also, the current to be supplied by each current segment may be set to the same value. Also, the current to be supplied by a part of the current segments may be weighted in a binary manner, and the current to be supplied by each of the other current segments may be set to the same value.

A decoder 212 controls the current segment group CS31 with a first polarity and controls the current segment group CS32 with a second polarity, according to a common input code $D_{IN}$. Resistors R31 and R32 convert the differential currents generated by the pair of current segment groups CS31 and CS32 into the differential voltages $V_P$ and $V_N$, respectively.

The offset adjuster 256 includes a pair of correction current segment groups CS41 and CS42. The output of the current segment group CS41 is connected to the output of the current segment group CS31 of the D/A converter 210 so as to form a common output. Furthermore, the output of the current segment group CS42 is connected to the output of the current segment group CS32 of the D/A converter 210 so as to form a common output. The current to be generated by multiple current sources included in each of the correction current segment groups CS41 and CS42 is preferably designed to have a value that is smaller than 1 LSB of the D/A converter 210.

The logic circuit 254 controls an on/off operation for each of the multiple current sources included in the correction current segment groups CS41 and CS42, thereby independently controlling the offset currents $I_{OFSP}$ and $I_{OFSN}$. The differential voltages $V_P$ and $V_N$ are shifted according to the offset currents $I_{OFSP}$ and $I_{OFSN}$. Specifically, when the offset current $I_{OFSP}$ is generated, the differential voltage $V_P$ is shifted toward the lower electric potential side by (R31× $I_{OFSP}$). In this case, the output $V_{SE}$ of the differential to single-ended conversion circuit 230 is shifted toward the lower electric potential side. Conversely, when the offset current $I_{OFSN}$ is generated, the differential voltage $V_N$ is shifted toward the lower electric potential side by (R32× $I_{OFSN}$). In this case, the output $V_{SE}$ of the differential to single-ended conversion circuit 230 is shifted toward the high electric potential side.

The logic circuit 254 monitors a first comparison signal $S_{CMP1}$ configured as an output of the voltage comparator 252. Furthermore, the logic circuit 254 optimizes the offset amount, which is to be supplied from the offset adjuster 256 to the D/A converter 210, such that the output voltage $V_{SE}$ of the differential to single-ended conversion circuit 230 becomes substantially the same as the reference voltage $V_{REF}$.

The method for adjusting the offset amount and the algorithm thereof are not restricted in particular. For example, the voltage comparator 252 may be configured as a window comparator. With such an arrangement, a pair of reference voltages $V_{REFH}$ and $V_{REFL}$ may be set in the vicinity of the reference voltage $V_{REF}$. Also, the offset amount may be optimized such that the voltage $V_{SE}$ is positioned within a range between the pair of reference voltages $V_{REFH}$ and $V_{REFL}$. With such an arrangement, the logic circuit 254 may scan the offset amount, i.e., the output current $I_{OFS}$ of either one of the current segment group CS41 or CS42, from an initial value (e.g., zero). Also, the logic circuit 254 may stop the offset scanning immediately after the relation $V_{REFH} < V_{SE} < V_{REFL}$ holds true.

Alternatively, the voltage comparator 252 may be configured as a single comparator. With such an arrangement, the offset amount supplied from the offset adjuster 256 may be incremented (or otherwise decremented) from zero in a stepwise manner. Also, such an arrangement may detect a point at which the first comparison signal $S_{CMP1}$ changes.

The calibration circuit 250 preferably operates after a predetermined period of time $T_{TIMER}$ elapses after the audio circuit 200 starts up. In order to meet such a requirement, the logic circuit 254 includes a digital timer circuit (clock counter) as a built-in component. Alternatively, an analog timer circuit is provided as an external component.

The calibration circuit 250 further includes a threshold voltage source 258 and a selector 260. The threshold voltage source 258 includes resistors R41 and R42, which divide the power supply voltage $V_{DD}$ so as to generate a predetermined threshold voltage $V_{TH}$. The selector 260 receives the output voltage $V_{SE}$ of the differential to single-ended conversion circuit 230 and the threshold voltage $V_{TH}$, and selects one from among the output voltage $V_{SE}$ and the threshold voltage $V_{TH}$ thus received, according to an instruction from the logic circuit 254. Before the calibration operation after the audio circuit 200 starts up, the logic circuit 254 sets a control signal S1 to a first level (e.g., low level) so as to instruct the selector 260 to select the threshold voltage $V_{TH}$. In the calibration operation, the logic circuit 254 sets the control signal S1 to a second level (e.g., high level) so as to instruct the selector 260 to select the voltage $V_{SE}$.

The threshold voltage $V_{TH}$ is set to be slightly lower than the reference voltage $V_{REF}$ that develops in the steady state. Accordingly, the voltage dividing ratio provided by the resistors R41 and R42 may preferably be designed to be slightly lower than the voltage dividing ratio provided by the resistors R21 and R22 of the reference voltage source 240 shown in FIG. 3.

During a period in which the selector 260 selects the threshold voltage $V_{TH}$, the voltage comparator 252 functions as a second comparator that compares the reference voltage $V_{REF}$ with the threshold voltage $V_{TH}$. That is to say, in this state, when the reference voltage $V_{REF}$ exceeds the threshold voltage $V_{TH}$, the voltage comparator 252 asserts a second comparison signal $S_{CMP2}$. By making a combination of the voltage comparator 252 and the selector 260, such an arrangement allows the voltage comparator 252 to have two different comparator functions for different respective comparison targets.

When the second comparison signal $S_{CMP2}$ is asserted, the logic circuit 254 instructs the selector 260 to select the voltage $V_{SE}$, which starts the calibration operation.

The above is the configuration of the audio circuit 200. Next, description will be made regarding the operation of the audio circuit 200.

Figure 5:
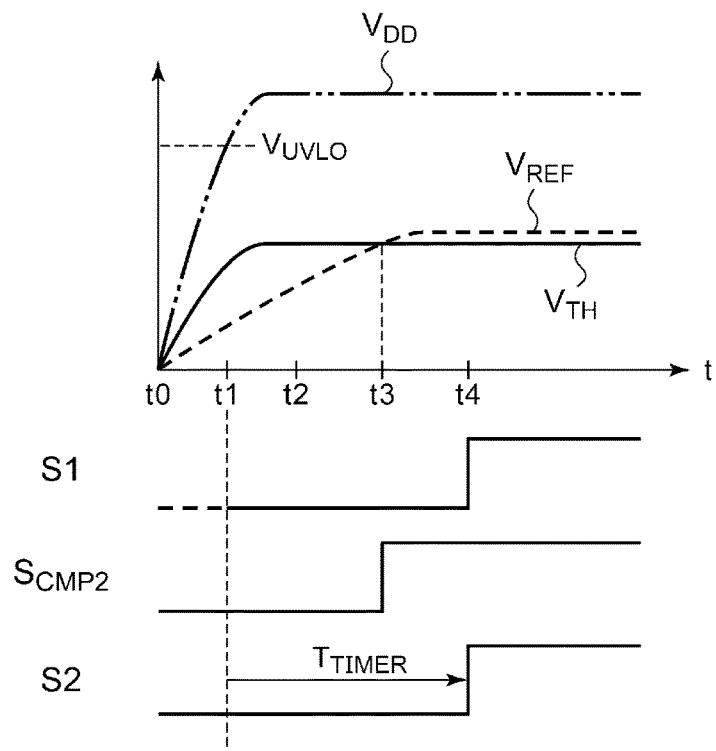

First, description will be made regarding the operation before the calibration operation. FIG. 5 is an operation waveform diagram showing the operation of the audio circuit 200 after the power supply is turned on. At the time point t0, the power supply is turned on. After the time point t0, the power supply voltage $V_{DD}$ rises with the passage of time. The threshold voltage $V_{TH}$ generated by the threshold voltage source 258 increases such that it follows the rise of the power supply voltage $V_{DD}$. After the power supply voltage $V_{DD}$ exceeds a threshold value $V_{UVLO}$ at the time point t1, the circuit blocks including the calibration circuit 250 are able to operate. In this stage, the logic circuit 254 sets the control signal S1 to the low level, which instructs the voltage comparator 252 to operate as a second voltage comparator that compares the reference voltage $V_{REF}$ with the threshold voltage $V_{TH}$.

At the time point t2, the power supply voltage $V_{DD}$ and the threshold voltage $V_{TH}$ reach their respective normal levels. On the other hand, the reference voltage $V_{REF}$ requires a longer time period to rise than that of the threshold voltage $V_{TH}$ due to the effect of the capacitor C21. When the reference voltage $V_{REF}$ reaches the threshold voltage $V_{TH}$ at the time point t3, the second comparison signal $S_{CMP2}$ is asserted (set to the high level).

At the time point t1, an internal timer of the logic circuit 254 starts time measurement. At the time point t4 after a predetermined time period $T_{TIMER}$ elapses, a timer signal S2 is asserted. When both the second comparison signal $S_{CMP2}$ and the timer signal S2 are asserted, the logic circuit 254 sets the control signal S1 to the high level, which switches the audio circuit 200 to the calibration operation mode.

The above is the configuration of the audio circuit 200. Next, description will be made regarding the operation thereof.

Figure 6:
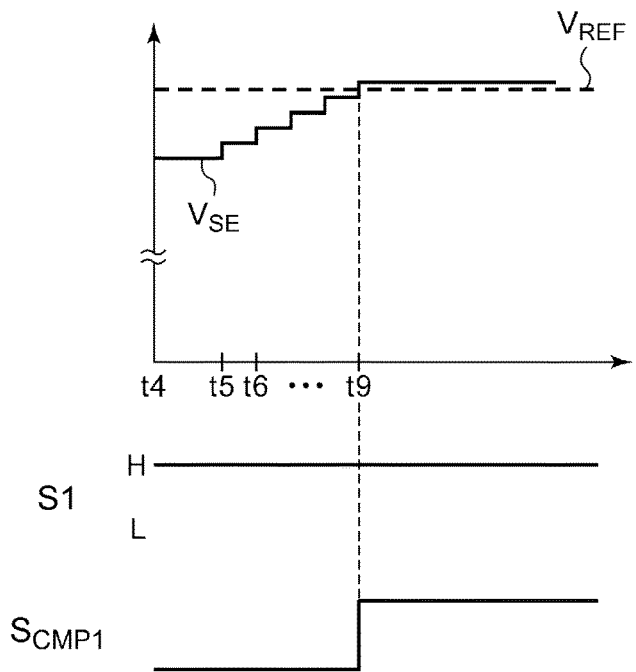
FIG. 6 is a waveform diagram showing the calibration operation of the audio circuit.

FIG. 6 is a waveform diagram showing the calibration operation of the audio circuit 200. In the calibration operation, the input $D_{IN}$ of the D/A converter 210 is fixed to zero. Let us consider a case in which, at the time point t4, the relation $V_{SE}<V_{REFL}$ holds true. In this case, the output (first comparison signal) $S_{CMP1}$ of the first voltage comparator 252 is set to the low level. At the time point t5, the logic circuit 254 controls the offset adjuster 256 such that the single-ended signal $V_{SE}$ shifts toward the higher electric potential side. After this operation, the relation $V_{SE}<V_{REF}$ remains. Thus, at the time point t6, the logic circuit 254 controls the offset adjuster 256 such that the single-ended signal $V_{SE}$ further shifts toward the higher electric potential side. After this operation is repeatedly performed, the relation $V_{SE}>V_{REF}$ becomes true at the time point t9, which switches the first comparison signal $S_{CMP1}$ to the high level.

When the first comparison signal $S_{CMP1}$ is switched to the high level, the logic circuit 254 holds the offset amount (shift amount) that has been set for the offset adjuster 256 in this stage, and the calibration operation ends.

After the completion of the calibration, such an arrangement enables a normal audio playback operation. In the audio playback operation, the D/A converter 210 is provided with an offset set in the calibration operation.

The above is the operation of the audio circuit 200. The audio circuit 200 has the following advantages.

By providing the D/A converter 210 with a correction offset, such an arrangement is capable of canceling out the effect of an offset voltage present in the D/A converter 210 or the differential to single-ended conversion circuit 230. By canceling out the offset voltage present in the D/A converter 210 or the differential to single-ended conversion circuit 230, such an arrangement is capable of reducing DC shock noise that can occur when the audio circuit 200 is started up or when the volume is switched.

Furthermore, after the predetermined time period $T_{TIMER}$ elapses and the reference voltage $V_{REF}$ exceeds the threshold voltage $V_{TH}$ after the audio circuit is started up, the calibration circuit 250 starts the calibration operation. This ensures that the calibration is performed after the reference voltage $V_{REF}$ is sufficiently stabilized, thereby providing the calibration with improved precision.

Description has been made above regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 7:
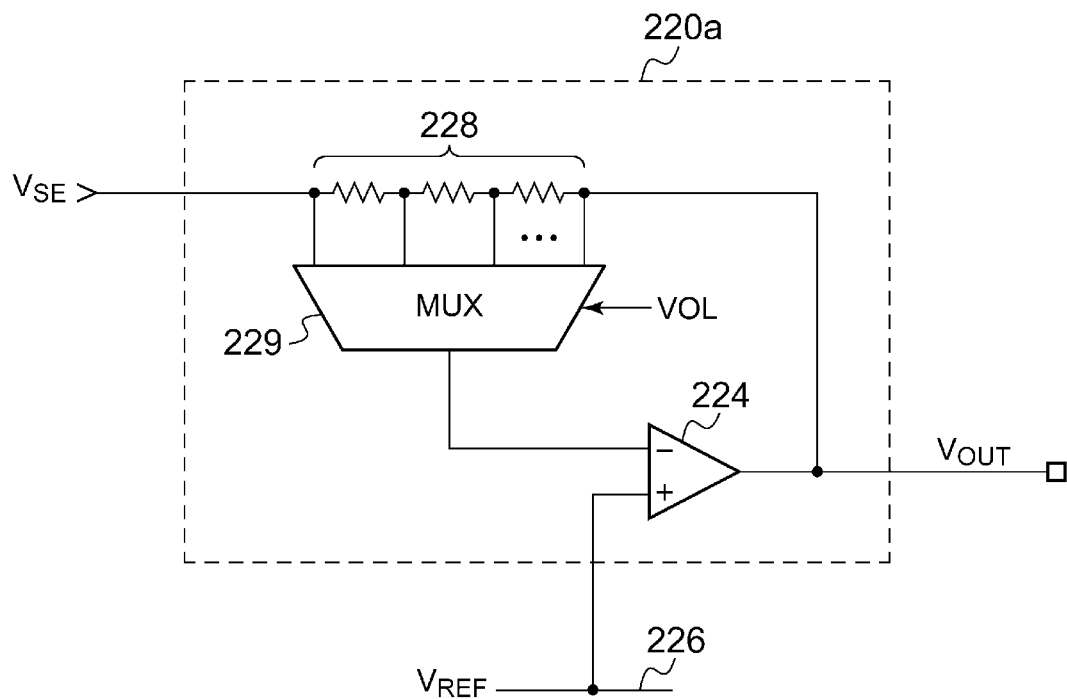
FIG. 7 is a circuit diagram showing a volume circuit according to a first modification.

The configuration of the volume circuit 220 is not restricted to such an arrangement shown in FIG. 3. FIG. 7 is a circuit diagram showing a volume circuit 220a according to a first modification. The volume circuit 220a is configured as an inverting-type circuit, including a resistor ladder 228, a multiplexer 229, and a non-inverting amplifier 224. The resistor ladder 228 receives, via its one end, the output voltage $V_{SE}$ of the differential to single-ended conversion circuit 230. The other end of the resistor ladder 228 is connected to the output terminal of the non-inverting amplifier 224. The resistor ladder 228 is provided with multiple taps. The multiplexer 229 selects one from among the multiple taps according to the volume setting value VOL, and outputs the voltage that corresponds to the tap thus selected to the inverting input terminal (−) of the non-inverting amplifier 224. The non-inverting input terminal (+) of the non-inverting amplifier 224 is connected to the reference voltage line 226, and receives the supply of the reference voltage $V_{REF}$. Also, the volume circuit 220 may be configured as other known circuits.

[Second Modification]

The configuration of the D/A converter 210 is not restricted to such a current segment configuration. For example, the D/A converter 210 may have a switched capacitor filter configuration. Examples of conceivable methods for applying an offset to such a switched capacitor filter D/A converter include: a method in which the clock frequency is changed; a method in which multiple correction capacitor segments are added; and the like.

[Third Modification]

Description has been made in the embodiment regarding an arrangement in which the calibration operation is performed every time the power supply of the audio circuit 200 is turned on. Also, in a case in which the audio circuit 200 includes nonvolatile memory as a built-in component, the calibration operation may be performed with a reduced frequency. Also, the calibration may be performed only once before or after shipment.

[Usage]

Figure 8:
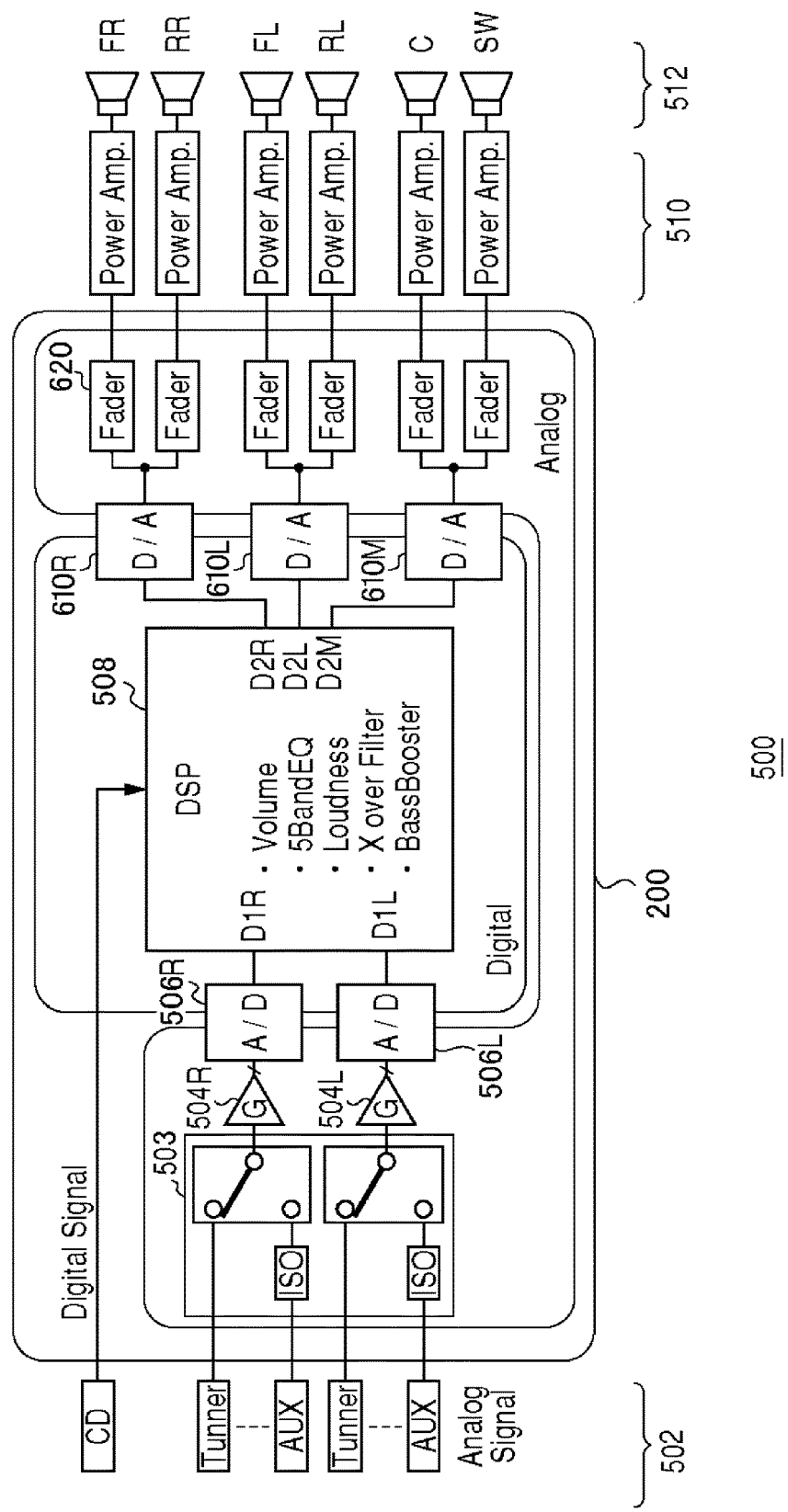
FIG. 8 is a block diagram showing a configuration of an in-vehicle audio apparatus employing an audio circuit.

Lastly, description will be made regarding the usage of the audio circuit 200. FIG. 8 is a block diagram showing a configuration of an in-vehicle audio apparatus 500 employing the audio circuit 200. The in-vehicle audio apparatus 500 is configured as a 5.1 channel system (front right FR, rear right RR, front left FL, rear left RL, center C, subwoofer SW).

The audio circuit 200 receives a digital input signal from a sound source 502 such as a CD player or the like. The digital input signal, which is output from the CD player, is directly input to a DSP 508. Furthermore, a stereo analog audio signal output from a tuner is input to TUNER channels. In addition, stereo analog audio signals, which can be output from other kinds of circuits such as a mobile audio player or the like, are input to AUX channels.

An input selector 503 selects the input channel, and an amplifier 504 converts a single-ended analog audio signal input to the selected channel into a differential signal. In a case in which an audio signal input to the selected channel is configured as a differential signal, the differential conversion processing is skipped.

An A/D converter 506R converts an input audio signal of the R channel configured as a differential signal into a digital audio signal. An A/D converter 506L converts an input audio signal of the L channel configured as a differential signal into a digital audio signal.

The DSP 508 includes a digital volume circuit, a 5-band equalizer, a loudness circuit, a crossover filter, and a bass booster circuit. The DSP 508 performs predetermined signal processing on the digital audio signals D1R and D1L.

A D/A converter 610R converts an R-channel digital audio signal D2R into a differential analog audio signal. A D/A converter 610L converts an L-channel digital audio signal D2L into a differential analog audio signal. A D/A converter 610M converts a digital audio signal D2M of the remaining channel into a differential analog audio signal. The D/A converters 610 correspond to a combination of the D/A converter 210 and the differential to single-ended conversion circuit 230 shown in FIG. 3. A fader volume 620 corresponds to the volume circuit 220 shown in FIG. 3.

The application employing the audio circuit 200 shown in FIG. 8 is not restricted to such an in-vehicle audio apparatus. Also, the audio circuit 200 is applicable to an audio component apparatus of a household audio system. Alternatively, the audio circuit 200 may be mounted on an electronic device such as a TV, a desktop PC, a laptop PC, a tablet PC, a cellular phone terminal, a digital still camera, a portable audio player, etc.

Figure 9A:
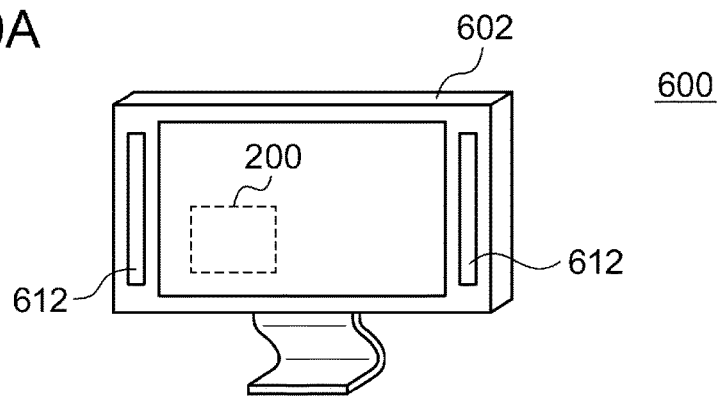
FIGS. 9A through 9C are external views each showing an electronic device or an audio component apparatus.
Figure 9B:
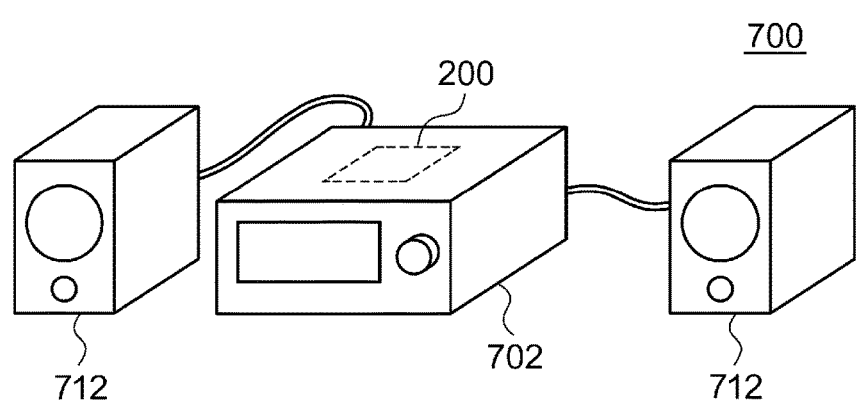
Figure 9C:
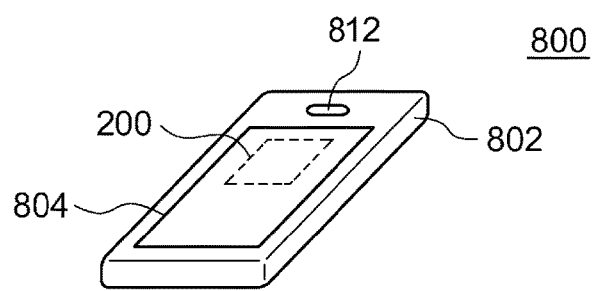

FIGS. 9A through 9C are external views each showing an electronic device or otherwise an audio component apparatus. FIG. 9A shows a display apparatus 600 which is an example of an electronic device. The display apparatus 600 includes a housing 602 and speakers 612. The audio circuit 200 is built into the housing, so as to drive the speakers 612.

FIG. 9B shows an audio component 700. The audio component 700 includes a housing 702 and speakers 712. The audio circuit 200 is built into the housing 702 and drives the speakers 712.

FIG. 9C shows a compact information terminal 800 which is an example of an electronic device. The compact information terminal 800 is configured as a smartphone, cellular phone, PHS (Personal Handy-phone System), PDA (Personal Digital Assistant), tablet PC (Personal Computer), audio player, or the like. The compact information terminal 800 includes a housing 802, a speaker 812, and a display 804. The audio circuit 200 is built into the housing 802 and drives the speaker 812.

While the preferred embodiments of the present invention have been described using specific terms, such description is for illustrative purposes only, and it is to be understood that changes and variations may be made without departing from the spirit or scope of the appended claims.

What is claimed is:

1. An audio circuit comprising:
   a differential digital-to-analog (D/A) converter that converts digital audio data into an analog differential audio signal;
   a differential to single-ended conversion circuit that converts the differential audio signal into a single-ended audio signal;
   a volume circuit that receives the single-ended audio signal, and amplifies the single-ended audio signal with a gain that corresponds to a volume value;
   a reference voltage source that generates a reference voltage commonly referred by the differential to single-ended conversion circuit and the volume circuit; and
   a calibration circuit that controls the differential D/A converter so as to shift at least one component of the differential audio signal in a calibration operation such that a difference between an output voltage of the differential to single-ended conversion circuit and the reference voltage becomes zero, wherein the calibration circuit comprises:
- a first voltage comparator that compares the output voltage of the differential to single-ended conversion circuit with the reference voltage, and that generates a first comparison signal that indicates a comparison result;
- an offset adjuster that shifts at least one component of the differential audio signal; and
- a logic circuit that changes an offset amount to be applied from the offset adjuster, while monitoring the first comparison signal.

2. The audio circuit according to claim 1, wherein the calibration circuit operates after a predetermined time period elapses after the audio circuit is started up.

3. The audio circuit according to claim 2, wherein the reference voltage source comprises:
- a first resistor and a second resistor arranged in series between a power supply line and a ground line;
- a capacitor connected to a connection node that connects the first resistor and the second resistor; and
- a voltage follower that receives a voltage at the connection node, and that outputs the reference voltage.

4. The audio circuit according to claim 1, wherein the calibration circuit further comprises:
- a threshold voltage source that generates a predetermined threshold voltage; and
- a second voltage comparator that compares the output voltage of the differential to single-ended conversion circuit with the threshold voltage, and asserts a second comparison signal when the output voltage exceeds the threshold voltage,
- and wherein, when the second comparison signal is asserted, the logic circuit starts the calibration operation.

5. The audio circuit according to claim 4, wherein a common comparator is employed as both the first voltage comparator and the second voltage comparator.

6. The audio circuit according to claim 1, wherein the differential D/A converter is configured as a current segment D/A converter,
- wherein the offset adjuster comprises a correction current segment group connected such that an output thereof is connected to an output of a current segment group of the differential D/A converter so as to form a common output,
- and wherein the logic circuit controls an on/off operation of each of a plurality of current sources included in the correction current segment group.

7. The audio circuit according to claim 1, wherein the differential D/A converter is configured as a switched capacitor filter D/A converter.

8. The audio circuit according to claim 1, monolithically integrated on a single semiconductor substrate.

9. An in-vehicle audio apparatus comprising the audio circuit according to claim 1.

10. An audio component apparatus comprising the audio circuit according to claim 1.

11. An electronic device comprising the audio circuit according to claim 1.

12. An audio circuit comprising:
- a differential digital-to-analog (D/A) converter that converts digital audio data into an analog differential audio signal;
- a differential to single-ended conversion circuit that converts the differential audio signal into a single-ended audio signal;
- a volume circuit that receives the single-ended audio signal, and amplifies the single-ended audio signal with a gain that corresponds to a volume value;
- a reference voltage source that generates a reference voltage commonly referred by the differential to single-ended conversion circuit and the volume circuit; and
- a calibration circuit that controls the differential D/A converter so as to shift at least one component of the differential audio signal in a calibration operation such that a difference between an output voltage of the differential to single-ended conversion circuit and the reference voltage becomes zero, wherein the reference voltage source comprises:
- a first resistor and a second resistor arranged in series between a power supply line and a ground line;
- a capacitor connected to a connection node that connects the first resistor and the second resistor; and
- a voltage follower that receives a voltage at the connection node, and that outputs the reference voltage.

* * * * *